(12) United States Patent
    Ovshinsky

(10) Patent No.:     US 8,168,268 B2
(45) Date of Patent:     May 1, 2012

(54) THIN FILM DEPOSITION VIA A SPATIALLY-COORDINATED AND TIME-SYNCHRONIZED PROCESS

(75) Inventor: Stanford R. Ovshinsky, Bloomfield Hills, MI (US)

(73) Assignee: Ovishinsky Innovation, LLC, Bloomfield Hills, MI (US)

( * ) Notice: Subject to any disclaimer, the term of this patent is extended or adjusted under 35 U.S.C. 154(b) by 402 days.

(21) Appl. No.: 12/316,417

(22) Filed: Dec. 12, 2008

(65) Prior Publication Data

US 2010/0151149 A1    Jun. 17, 2010

(51) Int. Cl.
    *C23C 16/00*   (2006.01)
    *H05H 1/24*    (2006.01)
(52) U.S. Cl. ......... 427/569; 427/575; 427/576; 427/578
(58) Field of Classification Search ............ 117/723 MP
    See application file for complete search history.

(56) References Cited

U.S. PATENT DOCUMENTS

| | | | | |
|---|---|---|---|---|
| 4,521,447 | A | * | 6/1985 | Ovshinsky et al. ............. 438/96 |
| 4,522,663 | A | * | 6/1985 | Ovshinsky et al. ............. 148/403 |
| 5,554,255 | A | * | 9/1996 | Karner et al. .................. 427/569 |
| 5,753,320 | A | * | 5/1998 | Mikoshiba et al. ............ 427/572 |
| 5,792,261 | A | * | 8/1998 | Hama et al. ................. 118/723 I |
| 6,365,016 | B1 | * | 4/2002 | Iacovangelo et al. .... 204/192.38 |
| 2001/0006093 | A1 | * | 7/2001 | Tabuchi et al. ................. 156/345 |
| 2004/0194701 | A1 | * | 10/2004 | Yadav et al. .................... 118/715 |
| 2005/0000563 | A1 | * | 1/2005 | Nakayama et al. ............. 136/255 |
| 2005/0005851 | A1 | * | 1/2005 | Keshner et al. ............ 118/723 E |
| 2005/0042373 | A1 | * | 2/2005 | Kraus et al. ................. 427/248.1 |
| 2007/0163996 | A1 | * | 7/2007 | Horiguchi ........................ 216/67 |
| 2007/0221623 | A1 | * | 9/2007 | Horiguchi et al. ............... 216/69 |

* cited by examiner

*Primary Examiner* — Timothy Meeks
*Assistant Examiner* — Joseph Miller, Jr.
(74) *Attorney, Agent, or Firm* — Kevin L. Bray

(57) ABSTRACT

A deposition system and process for the formation of thin film materials. In one embodiment, the process includes forming an initial plasma from a first material stream and allowing the plasma to evolve in space and/or time to extinguish species that are detrimental to the quality of the thin film material. After the initial plasma evolves to an optimum state, a second material stream is injected into the deposition chamber to form a composite plasma that contains a distribution of species more conducive to formation of a high quality thin film material. The deposition system includes a deposition chamber having a plurality of delivery points for injecting two or more streams (source materials or carrier gases) into a plasma region. The delivery points are staggered in space to permit an upstream plasma formed from a first material stream deposition source material to evolve before combining a downstream material stream with the plasma. Injection of different material streams is also synchronized in time. The net effect of spatial coordination and time synchronization of material streams is a plasma whose distribution of species is optimized for the deposition of a thin film photovoltaic material at high deposition rates. Delivery devices include nozzles and remote plasma sources.

63 Claims, 7 Drawing Sheets

THIN FILM DEPOSITION VIA A SPATIALLY-COORDINATED AND TIME-SYNCHRONIZED PROCESS

FIELD OF INVENTION

This invention relates to the plasma deposition of thin film materials. More particularly, this invention relates to deposition of thin films from a plasma composed of a distribution of compatible species carefully selected to form a photovoltaic material with high conversion efficiency. Most particularly, this invention relates to a plasma deposition process based on a deposition apparatus that includes multiple points of delivery, where the points of delivery provide each of one or more deposition species at preferential positions along the apparatus and where the delivery of species is coordinated in space and synchronized in time to promote stabilization of the optimum combination of species for deposition.

BACKGROUND OF THE INVENTION

Concern over the depletion and environmental impact of fossil fuels has stimulated strong interest in the development of alternative energy sources. Significant investments in areas such as batteries, fuel cells, hydrogen production and storage, biomass, wind power, algae, and solar energy have been made as society seeks to develop new ways of creating and storing energy in an economically competitive and environmentally benign fashion. The ultimate objective is to minimize society's reliance on fossil fuels and to do so in an economically competitive way that minimizes greenhouse gas production.

A number of experts have concluded that to avoid the serious consequences of global warming, it is necessary to maintain $CO_2$ at levels of 550 ppm or less. To meet this target, based on current projections of world energy usage, the world will need 17 TW of carbon-free energy by the year 2050 and 33 TW by the year 2100. The estimated contribution of various carbon-free sources toward the year 2050 goal are summarized below:

| Source | Projected Energy Supply (TW) |
| --- | --- |
| Wind | 2-4 |
| Tidal | 2 |
| Hydro | 1.6 |
| Biofuels | 5-7 |
| Geothermal | 2-4 |
| Solar | 600 |

Based on the expected supply of energy from the available carbon-free sources, it is apparent that solar energy is the only viable solution for reducing greenhouse emissions and alleviating the effects of global climate change.

The field of solar energy is currently dominated by solar cells utilizing crystalline silicon as the active photovoltaic material. Crystalline silicon, however, has a number of disadvantages as a solar energy material. First, preparation of crystalline silicon is normally accomplished through a seed-assisted Czochralski method. The method entails a high temperature melting process along with controlled cooling at near-equilibrium conditions and refining to produce a boule of crystalline silicon. Although high purity crystalline silicon can be achieved and the Czochralski method is amenable to n- and p-type doping, the method is inherently slow, expensive, and energy intensive.

Second, as an indirect gap material, crystalline silicon has a low absorption efficiency. Thick layers of crystalline silicon are needed to obtain enough absorption of incident sunlight to achieve reasonable solar conversion efficiencies. The thick layers add to the cost of crystalline silicon solar panels, lead to a significant increase in weight, necessitate bulky installation mounts, and make crystalline silicon solar panels rigid and unsuitable for applications requiring a flexible photovoltaic material.

A number of alternatives to crystalline silicon are currently being pursued in an effort to achieve more versatile, more efficient and less expensive photovoltaic materials. Among the alternatives are CdTe, CdS, and CIGS (Cu—In—Ga—Se alloys). CdTe and CdS suffer from the problem that Cd is a toxic element that requires special disposal procedures. In addition, Te is a relatively scarce element, having an abundance comparable to that of Pt. Although CIGS shows promising solar efficiency, it is difficult to achieve uniform stoichiometry over the large scale substrates required for high-volume manufacturing.

Amorphous silicon (and hydrogenated or fluorinated forms thereof) is an attractive alternative to crystalline silicon. Amorphous silicon is a direct gap material with a high absorption efficiency. As a result, lightweight and efficient solar cells based on thin layers of amorphous silicon and related materials are possible. The instant inventor, Stanford R. Ovshinsky, is the seminal figure in modern thin film semiconductor technology. Early on, he recognized the advantages of amorphous silicon (as well as amorphous germanium, amorphous alloys of silicon and germanium as well as doped, hydrogenated and fluorinated versions thereof) as a solar cell material and was the first to recognize the advantages of nanocrystalline silicon as a photovoltaic material. Stanford R. Ovshinsky also pioneered the automated and continuous manufacturing techniques needed to produce thin film, flexible large-area solar panels based on amorphous, nanocrystalline, microcrystalline, polycrystalline or composite semiconductors Representative discoveries of Stanford R. Ovshinsky in the field of amorphous semiconductors and photovoltaic materials are presented in U.S. Pat. No. 4,400,409 (describing a continuous manufacturing process for making thin film photovoltaic films and devices); U.S. Pat. No. 4,410,588 (describing an apparatus for the continuous manufacturing of thin film photovoltaic solar cells); U.S. Pat. No. 4,438,723 (describing an apparatus having multiple deposition chambers for the continuous manufacturing of multilayer photovoltaic devices); U.S. Pat. No. 4,217,374 (describing suitability of amorphous silicon and related materials as the active material in several semiconducting devices); U.S. Pat. No. 4,226,898 (demonstration of solar cells having multiple layers, including n- and p-doped); U.S. Pat. No. 5,103,284 (deposition of nanocrystalline silicon and demonstration of advantages thereof); and U.S. Pat. No. 5,324,553 (microwave deposition of thin film photovoltaic materials) as well as in articles entitled "The material basis of efficiency and stability in amorphous photovoltaics" (Solar Energy Materials and Solar Cells, vol. 32, p. 443-449 (1994); and "Amorphous and disordered materials—The basis of new industries" (Materials Research Society Symposium Proceedings, vol. 554, p. 399-412 (1999).

Current efforts in photovoltaic material manufacturing are directed at increasing the deposition rate. Higher deposition rates lower the cost of thin film solar cells and lead to a decrease in the unit cost of electricity obtained from solar energy. As the deposition rate increases, thin film photovoltaic materials become increasingly competitive with fossil fuels as a source of energy. Presently, PECVD (plasma-enhanced chemical vapor deposition) is the most cost-effective method for the commercial-scale manufacturing of amorphous silicon and related solar energy materials. Current PECVD processes provide uniform coverage of large-area substrates with device quality photovoltaic material at a deposition rate of ~2-3 Å/s and work directed at new processes with deposition rates of 10 Å/s and above is in progress.

In order to improve the economic competitiveness of plasma deposition processes, it is desirable to increase the deposition rate. Increases in deposition rate require strategies for overcoming basic limitations associated with current plasma deposition techniques. One problem with current plasma-deposited photovoltaic materials is the presence of a high concentration of intrinsic defects in the as-deposited state. The intrinsic defects include structural defects (e.g. dangling bonds, strained bonds, unpassivated surface states, non-tetrahedral bonding distortions, coordinatively unsaturated silicon or germanium) that create electronic states within the bandgap of the photovoltaic material. The midgap states detract from solar conversion efficiency by acting as nonradiative recombination centers that deplete the concentration of free carriers generated by absorbed sunlight. Instead of being available for external current, the energy of many of the photoexcited free carriers is dissipated thermally through nonradiative decay. The external current delivered by a photovoltaic material is reduced accordingly.

The intrinsic defects are also believed to contribute to a degradation of solar cell performance of amorphous silicon-based photovoltaic materials through the Staebler-Wronski effect. The Staebler-Wronski effect is a photo-induced degradation of the performance of amorphous silicon and related materials (e.g. hydrogenated, fluorinated or doped forms thereof) that is responsible for a decrease in solar efficiency of up to 25%. Although the origin of the Staebler-Wronski effect has not been definitively established, it is believed to be caused in part by the relatively high diffusion coefficient of hydrogen and the changes in local bonding coordination promoted by hydrogen.

One strategy for reducing the concentration of intrinsic defects in plasma-deposited photovoltaic materials is to include species in the plasma that provide defect compensating agents that can be incorporated into the deposited film. Inclusion of excess hydrogen in the plasma, for example, leads to a marked improvement in the quality of the material and the ability to make nanocrystalline phases in amorphous silicon by promoting the incorporation of hydrogen as a defect compensating agent in the film. Compensating agents passivate defects, saturate bonds, relieve bond strain and remove non-tetrahedral structural distortions that may occur in as-deposited thin film materials. As a result, the concentration of midgap band states is reduced and higher solar conversion efficiency is achieved.

Recognizing that the use of excess $H_2$ leads to poor gas utilization, incomplete passivation of defects, and the generation of various undesirable species in the plasma, S.R. Ovshinsky has advocated the use of fluorine as a compensating agent. In particular, S.R. Ovshinsky has shown that the inclusion of fluorine provides more regular bonding, leads to fewer defects, and enables deposition of nanocrystalline phases. (See U.S. Pat. No. 5,103,284 (formation of nanocrystalline silicon from $SiH_4$ and $SiF_4$); U.S. Pat. No. 4,605,941 (showing substantial reduction in defect states in amorphous silicon prepared in presence of fluorine); and U.S. Pat. No. 4,839,312 (presents several fluorine-based precursors for the deposition of amorphous and nanocrystalline silicon)).

S.R. Ovshinsky has further shown that the Staebler-Wronski effect is greatly diminished in nanocrystalline silicon. Through formation of nanocrystalline silicon or a nanocrystalline phase within an amorphous silicon matrix, photodegradation and light soaking effects are greatly ameliorated. Nanocrystalline silicon provides sufficient order to minimize intrinsic defects while providing enough structural flexibility to avoid the disadvantages associated with the rigid lattice of crystalline silicon. As a result, nanocrystalline silicon provides high carrier mobility, high photocurrents, and a stable photovoltaic response.

In addition to forming materials having a low concentration of defects, it is desirable to deposit materials that exhibit favorable electronic properties. In photovoltaic materials, for example, a high collection efficiency of photo-excited carriers is desired. When incident sunlight penetrates and is absorbed by a photovoltaic material, it creates photo-excited carriers in the interior of the material by promoting electrons from the valence band to the conduction band. In order to harness electrical energy from the photovoltaic material, it is necessary for the photo-excited carriers to move through the material to an electrical contact placed at the surface of the material. The ability of photo-excited carriers to reach surface contacts depends on the concentration of defects within the material and on the transport properties of the carriers. Carrier mobility is a measure of the ease with which carriers can migrate spatially within a material and carrier collection is facilitated if the mobility of electrons and holes is high. Excess photo-excited carrier is trapping, recombination, or other dissipation leads to low carrier mobility and reduces the likelihood that carriers are extracted from the material to contribute to an external current.

A drawback of amorphous silicon as a solar energy material is its low hole mobility. The low hole mobility reduces solar efficiency and makes simple p-n junction devices based on amorphous silicon impractical. Instead, inclusion of an intrinsic layer and more complicated p-i-n structures are needed to compensate for poor hole mobility.

An alternative strategy for overcoming the poor hole mobility of amorphous silicon was invented by S. R. Ovshinsky in U.S. Pat. No. 5,103,284 (the '284 patent). The '284 patent describes the formation of a clustered semiconductor material, with dimensions on the order of 10-50 Å (and up to 100 Å), having a state of order intermediate between the extended periodic lattice structure of crystalline silicon and the random, disordered structure of amorphous silicon.

Ovshinsky showed that the intermediate range order nature of the ordered cluster material represents a new state of matter having properties that combine features of the amorphous and crystalline phases. In particular, Ovshinsky showed that the ordered cluster material possesses the high carrier mobility of crystalline silicon and the high absorption efficiency of amorphous silicon. Ovshinsky has also proved by direct observation that the intermediate range order state is a new form of order that is two-dimensional in character without grain boundaries and the defects that accompany them.

Within the size range of the ordered cluster material of the '284 patent, Ovshinsky showed that the bandgap becomes more direct and the absorption coefficient increases as size decreases. The dimensions of the ordered cluster material are in the quantum regime, a new regime of order in which selection rules are relaxed and different principles govern electronic properties. In the quantum regime, the bandgap is more direct and the photovoltaic response of the material is more stable because the factors responsible for the Staebler-Wronski effect are absent.

Ovshinsky has further shown that fluorine promotes the formation of intermediate range order material and that fluorine is particularly advantageous as a component of thin film photovoltaic materials because of its ability to eliminate surface states that serve as traps for photo-excited carriers.

Ovshinsky has also been a pioneer in developing diagnostic methods, including Raman spectroscopy, for detecting ordered clusters and has elucidated the concept of intermediate range order as a signature for high quality photovoltaic materials. Although the ordered cluster material has desirable properties, current techniques for forming it suffer from low deposition rates.

A need exists in the art for a method for preparing photovoltaic materials (including amorphous, nanocrystalline, microcrystalline, and polycrystalline forms of silicon, germanium, and alloys of either) at high deposition rates without sacrificing photoexcitation efficiency, carrier collection efficiency, and other attributes of quality. The low deposition rates needed to achieve high efficiency photovoltaic materials through conventional plasma deposition techniques limit the economic competiveness of photovoltaic materials relative to fossil fuels and motivate a search for new deposition processes.

SUMMARY OF THE INVENTION

The instant invention provides a method and apparatus for the plasma deposition of thin film materials. In one embodiment, the invention is directed at the plasma deposition of photovoltaic materials at high deposition rates with improved photovoltaic efficiency by providing a method and apparatus for controlling plasma composition and the timing of the delivery of species to the plasma. The invention recognizes that the plasmas used in prior art deposition processes include species that are detrimental to photovoltaic efficiency.

In the instant deposition method, the composition of the plasma is controlled to provide a distribution of species adjacent to the deposition surface that promotes the formation of an as-deposited photovoltaic material having improved composition and structure and therefore stable high conversion efficiency. The method includes the controlled injection of streams containing energy transfer gases, reactant species, and/or deposition precursors into a deposition chamber, where the injection of different streams may be separated spatially and temporally so as to optimize the formation and combination of species present in the deposition medium adjacent to the deposition front of a substrate or the material being formed on the substrate.

The deposition apparatus includes a deposition chamber equipped with a plurality of delivery points for introducing material streams (energy transfer gases, reactant species and/or deposition precursors) to the chamber. A different stream composition may be provided at each delivery point. The delivery points are distributed at different positions along the deposition chamber so that the injection of streams is spatially controlled and coordinated. In addition, the timing of injection can be controlled to synchronize delivery of streams to insure that the plasma encountered by an injected stream has evolved in time to a state most compatible with receipt of a particular newly-injected stream.

Delivery devices that inject material streams at the delivery points of the apparatus include conduits, apertures, nozzles and remote plasma sources. The delivery devices may be staggered in one or more dimensions in space and may also be mobile or repositionable between or during the process of delivering a stream of material to the deposition system.

DETAILED DESCRIPTION OF THE ILLUSTRATED EMBODIMENTS

Although this invention will be described in terms of certain preferred embodiments, other embodiments that are apparent to those of ordinary skill in the art, including embodiments that do not provide all of the benefits and features set forth herein and including embodiments that provide positive benefits for high-volume manufacturing, are also within the scope of this invention. Accordingly, the scope of the invention is defined only by reference to the appended claims.

The instant invention focuses on a plasma deposition process in which the state of the plasma is engineered to optimize the structural and electronic quality of an as-deposited thin film material. In one embodiment, the thin film material is a photovoltaic material. The invention is designed to remedy deficiencies in the plasma that forms naturally in a conventional plasma deposition process. In the prior art, a plasma is normally formed by first delivering a molecular precursor and a carrier gas to a common plasma initiation region. The molecular precursor and carrier gas are typically provided as admixed continuous streams and directed to a common point within the plasma initiation region. The plasma initiation region is located between a cathode and an anode, where the substrate often serves as the anode. A plasma is formed by applying a high strength electric field between the anode and cathode. In most deposition processes, the plasma is maintained at a radiofrequency. Microwave plasmas may also be used.

Figure 1:
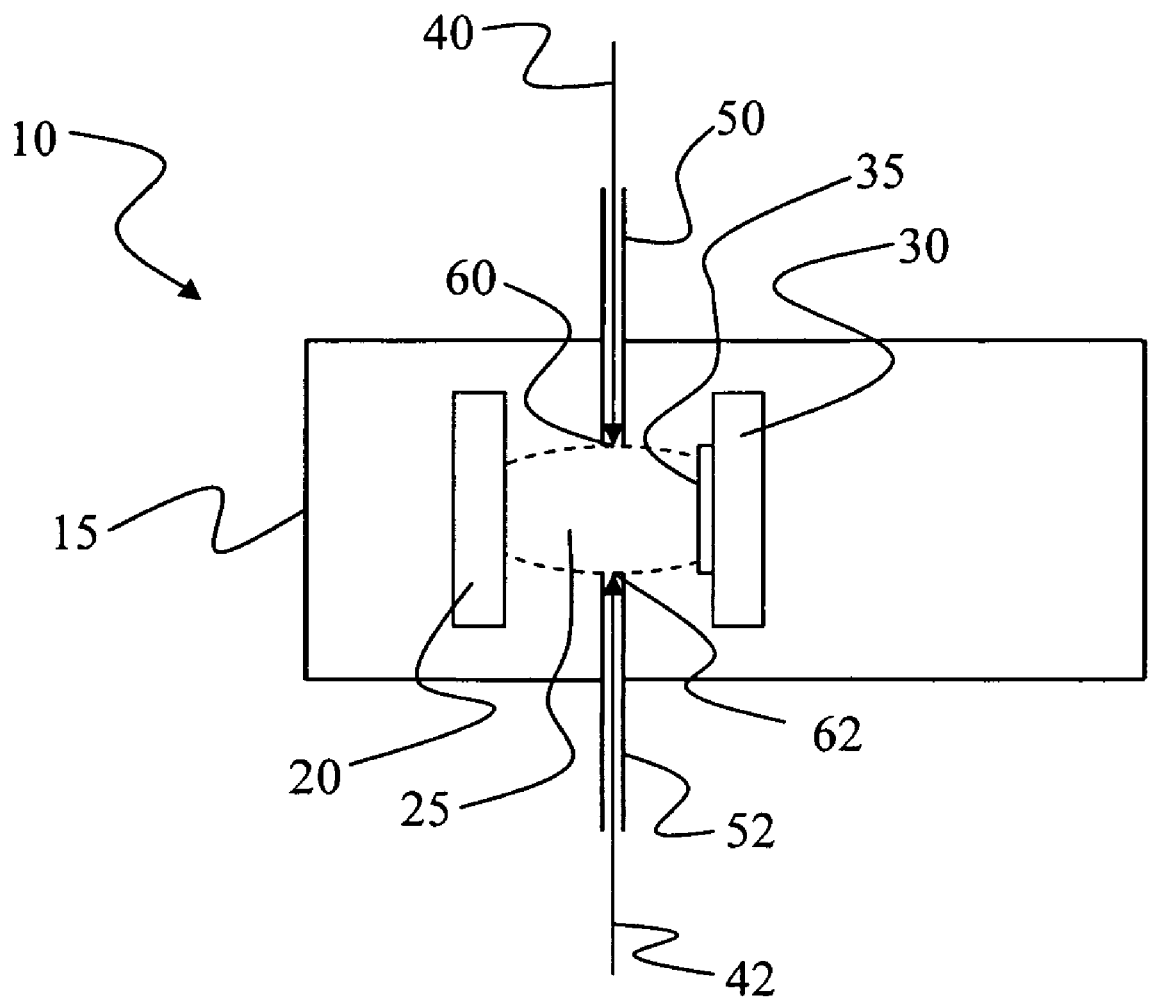
FIG. 1 depicts a conventional plasma reactor configuration for a plasma deposition process according to the prior art.

FIG. 1 illustrates a typical plasma reactor design of the prior art. The reactor includes deposition apparatus 10 having deposition chamber 15 equipped with delivery device 50 and delivery device 52. Within deposition chamber 15 are cathode 20 and anode 30, with substrate 35 positioned thereon. Stream 40 and stream 42 are provided to deposition chamber 15 and directed toward a common point in plasma region 25. Stream 40 and stream 42 may be precursor gases, carrier gases, diluent gases, or mixed streams including a combination thereof. Stream 40 exits delivery device 50 at delivery point 60 and stream 42 exits delivery device 52 at delivery point 62. A power supply (not shown) connected to cathode 20 and anode 30 provides the electric field needed to initiate a plasma in region 25. Although plasma region 25 is depicted for convenience as extending from the surface of cathode 120 to the surface of anode 130, it is to be understood that dead zones (dark spaces) are present immediately adjacent to the surfaces of cathode 120 and anode 130. The presence of dead zones is inherent in the plasma activation process and insures that cathode 120 and anode 130 are not etched or otherwise damaged by the plasma. Analogous considerations apply to depictions of plasma regions in the figures presented hereinbelow.

The plasma formed in a conventional process includes a random and chaotic distribution of species in a steady state, dynamic equilibrium condition. The species may include molecules of the source material (e.g. precursor or carrier gas) as well as a distribution of metastable intermediate species. The metastable species include ions, ion-radicals and neutral radicals derived from the elements and fragments of the precursor or carrier gas molecules.

Figure 2:
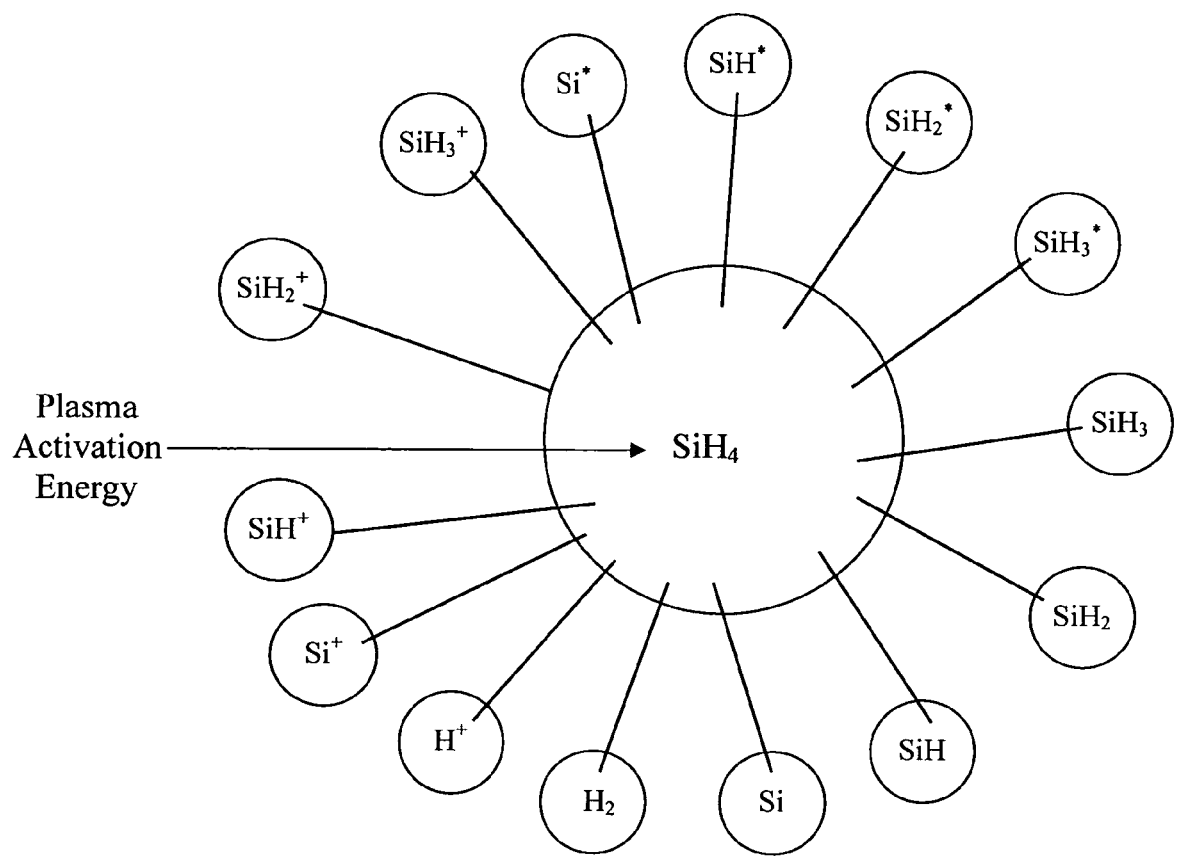
FIG. 2 depicts potential metastable species that may be formed from silane in a plasma deposition process.

By way of example, the plasma deposition of amorphous silicon occurs by delivering the molecular precursor silane ($SiH_4$) as a source material to a deposition chamber. FIG. 2 depicts potential metastable species that may be present when silane is activated to form a plasma. The metastable intermediates present in a silane plasma include a variety of ions, radicals and molecular species. The radicals may be neutral or charged. Neutral radicals include $SiH_3$, $SiH_2$, SiH, Si, and H. The species may be in a ground electronic state or an excited electronic state (designated by an asterisk (e.g. SiH* is a neutral radical in an excited electronic state)).

One of the limitations of a conventional plasma deposition process is an inability to adequately control the identity and abundance of the different metastable species in the plasma. The need to control the characteristics of the plasma arises because some of the species present in the plasma are essential or beneficial to the deposition of the intended thin film material, while other species are detrimental. In the case of silicon deposition from silane, for example, the neutral radical $SiH_3$ is generally believed to be beneficial in forming high quality materials based on amorphous silicon, while the neutral radical $SiH_2$ is thought to be detrimental because its incorporation into the as-deposited material creates dihydride defects that compromise solar efficiency through nonradiative processes.

Control over the composition and distribution of species in the plasma, therefore, is a desirable step toward the goal of improving the quality of plasma-deposited materials. While some degree of control is available in the prior art plasma activation process through variations in process degrees of freedom such as temperature, pressure, concentration, flow rate, electron temperature and electron density, greater control is needed to permit deposition of photovoltaic materials having sufficient conversion efficiency at high deposition rates. Current methods of forming a plasma provide only coarse control over the state of the plasma and optimization of conventional plasma deposition techniques is a largely empirical exercise that seeks to find a sweet spot for deposition.

Ideally, it would be desirable to restrict the species present in the plasma to only those species that are conducive to formation of high quality thin film materials, while rejecting deleterious species. Previously, the instant inventor has proposed various ways of achieving this objective. In a series of recent patent applications (U.S. patent application Ser. Nos. 12/199,656; 12/199,712; 12/199,730; and 12/199,745), the instant inventor described various processes and apparatuses for separating a conventional plasma into preferred species and detrimental species and delivering the preferred species to a substrate for deposition. The separation was effected by a biased mesh that selectively rejected ionized species, while transmitting preferred neutral species. In a further patent application (U.S. patent application Ser. No. 12/209,699), the instant inventor described a method and apparatus for preselecting preferred metastable or intermediate species before deposition and delivering only those species to the deposition process to achieve as-deposited thin film materials with low defect concentration at high deposition rates.

In this invention, the instant inventor seeks to overcome the present limitations on controlling the composition and distribution of species in a plasma. The invention provides a method and apparatus for coordinating in space and synchronizing in time the delivery of source materials to a plasma deposition chamber. The instant invention recognizes that in prior art processes, the source materials for plasma deposition are delivered continuously in time and are directed to a common point in space for plasma generation. The instant inventor believes that greater control over the species present in a plasma can be achieved by removing these space and time limitations on plasma generation.

In the instant invention, source materials for plasma deposition are injected at multiple delivery points into the deposition chamber. A plurality of source material streams is injected at delivery points separated in space and directed to deliver streams away from a common point of interaction of the source materials. The delivery points of the instant apparatus inject the different source materials at strategic positions in the plasma region extending between the cathode and anode of a deposition apparatus, where each source material stream could be directed toward a different point of interaction with the plasma. In contrast to the prior art processes where different source materials are combined at a common point, this invention contemplates a distribution of delivery points along the distance spanned by the plasma and multiple combination points of a series of source materials with the plasma. The delivery points of the instant deposition system may also be referred to herein as injection points.

In one embodiment, the substrate serves as the anode and the plasma region effectively extends between the cathode and substrate. In this embodiment, multiple delivery points for injecting source material streams are aligned along the distance extending between the cathode and substrate and are staggered in space to provide multiple combination points of different source material streams with the plasma. In another embodiment, an anode distinct from the substrate is employed. In this embodiment, the plasma region extends between the cathode and anode and the substrate is positioned outside of the plasma region. A substrate positioned outside of the plasma region may be referred to herein as a remote substrate. Species generated in the plasma region are transported to the remote substrate and become deactivated upon exiting the plasma region as they progress toward the remote substrate. In this embodiment, delivery points may be positioned to inject source material streams to the plasma region between the cathode and anode or to inject source material streams outside of the plasma region. Material streams, for example, may be injected at one or more points to the deactivated deposition medium existing in the space between the plasma region and the remote substrate.

The instant invention contemplates a deposition medium that develops and evolves over distance in the deposition apparatus. In one embodiment, the deposition medium is a plasma positioned in a region between a cathode and an anode, where the anode functions as a substrate or the substrate is in electrical communication with the anode. In another embodiment, the deposition medium includes a deactivated portion existing outside of a plasma region formed between a cathode and anode in the deposition apparatus. In this embodiment, the substrate is located outside of the plasma region and the deactivated deposition medium is adjacent to the substate. The deposition medium may develop and evolve in the plasma region or the deactivated region of the deposition chamber.

The invention recognizes that when a material stream is injected into a deposition chamber and activated to form a plasma, the distribution of species created is dynamic and evolves in time due to differences in the lifetime of the different species and differences in the probability of regenerating the various species. The state of the plasma at one instant in time may differ from the state of the plasma at another instant in time. Similarly, when a plasma becomes deactivated and is transported away from a plasma region toward a remotely-positioned substrate, the characteristics of the various species included in the deactivated deposition medium may evolve in time due to differences in lifetime and interactions between the different species. As a result, the state of a deactivated deposition medium at one instant in time may differ from the state of the deactivated deposition medium at another instant in time.

In the deposition of a thin film material from a single precursor or other source material, the instant inventor reasons, without wishing to be bound by theory, that the distribution of species present in the growth zone immediately adjacent the deposition surface may be a function of the distance between the substrate and the point of injection of the precursor or other source materials. When the substrate is located near the point of injection, the growth zone is located closer to the point of injection and short-lived members of the distribution of species are more likely to participate in or influence the deposition process. When the substrate is further removed from the point of injection, the species in the plasma or deactivated deposition medium must be transported over some distance to reach the growth zone. This transport requires a certain amount of time and if the required transport time is long relative to the lifetime of a particular species in the plasma or deactivated deposition medium, the presence of that species in the growth zone is likely to be reduced. As a result, the growth process is influenced to a greater degree by long-lived members of the distribution of species in a plasma or deactivated deposition medium when the substrate is positioned further away from the point of delivery of a material stream.

When deposition of a particular thin film composition requires or can be enhanced by use of multiple source materials, further considerations arise. In particular, the order and timing of injecting source materials will influence the state of the plasma present at the growth surface. As an example, consider a deposition process that requires source material A and source material B. Suppose source material A is injected into a deposition chamber and activated to a plasma. Upon initiation of the plasma, an initial distribution of species is present. As noted above, this initial distribution of species may evolve in time and over distance as the species are transported from the delivery point to the growth surface. As the species in the plasma formed from source material A change, the potential of the plasma to interact with source material B changes. The scope and nature of interactions between a plasma formed from source material A with source material B will depend on the distribution of species in the plasma formed from source material A. As a result, the timing of the delivery of source material B to the plasma formed from source material A will influence the distribution of species in the composite plasma formed from source material A and source material B. A composite plasma formed by injecting source material B immediately after initiation of a plasma from source material A may differ from a composite plasma formed by delaying the injection source material B until the plasma formed from source material A has been allowed to evolve.

Similar considerations apply to injection of source materials with a deactivated deposition medium. As described hereinabove, a deactivated deposition medium may also evolve in time and over distance in the space between the plasma region and substrate in certain embodiments of the instant invention. The timing of injection of material streams into a deactivated deposition medium and the spatial placement of the point of delivery of material streams affect the nature of interactions and production of species in a composite deactivated deposition medium.

Control of the distribution of species in a composite plasma or composite deactivated deposition medium further extends to each of several additional material streams that may be injected and combined with a particular pre-existing composite plasma or composite deactivated deposition medium. As noted hereinabove, the distribution of species present in a composite plasma (or composite deactivated deposition medium) formed from material stream A and material stream B can be controlled by controlling the timing and spatial position of injection. When a third material stream C is utilized, the distribution of species in the ternary composite plasma or ternary composite deactivated deposition medium depends on the timing and point of injection of material stream C as well as the distribution of species present in the pre-existing composite plasma or composite deposition medium formed from material stream A and material stream B.

As a further example of the flexibility in the distribution of species afforded by the instant invention, the timing or spatial position of the injection of material stream B into a plasma or deactivated deposition medium formed from material stream A can be controlled to produce a composite plasma or composite deactivated deposition medium in which material stream A reacts with material stream B to give a particular species C which could then react or interact with subsequently injected material stream D to form a particular species E which is beneficial to the growth of the intended thin film composition. The foregoing embodiments demonstrating the versatility and degrees of freedom provided by the instant invention for controlling the distribution of species in a composite plasma or composite deactivated deposition medium is intended to be illustrative and not limiting. Various combinations of the foregoing illustrative steps are within the reach of one of skill in the art.

The instant invention seeks to maximize the quality of the deposited material by optimizing the distribution of species in the plasma and a key insight of the instant inventor is to recognize that the evolution in space and time of a plasma or deactivated deposition medium presents new degrees of freedom for controlling the state of the plasma. By controlling when and where source materials interact in a plasma or deactivated deposition medium, the distribution of species can be tailored to optimize the concentration of species favorable to the formation of a defect-free, high quality thin film material.

When multiple source materials are utilized for a deposition, synergies between the source materials govern the distribution of species present at the growth front. In the prior art process, multiple source materials are injected, combined, and activated at a common, localized position within the deposition chamber. A continuous stream of each source material is delivered simultaneously and the full range of species generated from one source material interacts with the full range of species generated from all other source materials.

The instant invention recognizes that some species generated from a particular source material lead to detrimental interactions with some species generated from other source materials. The strategy of the instant invention is to control the timing and spatial location of source material injection to promote beneficial interactions between species generated from different material streams. Detrimental interactions are reduced by delaying or staggering the injection of different source materials into the plasma region that extends between the anode and cathode or into the deactivated region between a plasma region and a substrate. By delaying in time or staggering in space, the distribution of species encountered by a newly injected source material can be controlled and the characteristics of the resulting composite plasma or deactivated deposition medium can be tuned. Control over the relative timing of the injection of source materials may be referred to herein as time synchronization of the delivery of source materials to the deposition chamber. Control over the relative spatial position of injection by staggering the points of delivery may be referred to herein as spatial coordination of the delivery of source materials to the deposition chamber.

Through time synchronization or spatial coordination, the state of the plasma encountered by newly injected source materials can be controlled. In particular, as an existing plasma is allowed to evolve in time or space, it is believed that short-lived species will be preferentially extinguished relative to long-lived species. The effect of a reduction in the presence of short-lived species may be beneficial or detrimental. For some source materials, short-lived species may promote the formation of high quality thin film materials, while for other source materials, short-lived species may impair the formation of high quality material.

In the case of a conventional silane plasma, for example, many of the highly energetic species are thought to have short lifetimes and are believed to be detrimental to the formation of high quality material. The energy and number density of the most prevalent species in a conventional silane plasma have been reported to be:

| Species | Energy (eV) | Number Density (cm$^{-3}$) |
|---|---|---|
| Si* | 10.53 | ~$10^5$ |
| Si | 10.36 | ~$10^8$-$10^9$ |
| SiH* | 10.33 | ~$10^5$ |
| SiH$_x^-$ | ~10 | ~$10^8$ |
| SiH | 9.47 | ~$10^8$-$10^9$ |
| SiH$_2$ | 9.47 | ~$10^9$ |
| SiH$_3$ | 8.75 | ~$10^{12}$ |
| SiH$_4$ | 0 | ~$10^{15}$ |

In the list, the energy of each species is reported relative to the ground state of silane.

The number density of each species represents a balance of its rate of generation and its rate of transformation to other species in the plasma. Transformation of a species can occur through internal decay processes (e.g. luminescence) or interactions of a species with other species. As a general rule, the number density of a particular species decreases as the number of other species with which the particular species can interact increases and as the concentration of such other species increases. In the list above, for example, silane is the most prevalent species and experiments indicate that all of the species in the list, except SiH$_3$, are depleted through interactions with silane. As a result of the efficient depletion channel, the lifetimes of these species are shortened and their number density is depressed. SiH$_3$, in contrast, is not depleted when it interacts with silane. The lack of an efficient depletion channel of SiH$_3$ with highly abundant silane contributes to a lengthening of the lifetime and increase in the number density of SiH$_3$. From this discussion, we see that the highly energetic species in a silane plasma are most efficiently depleted through interactions with silane.

The presence of the highly energetic species in a silane plasma is undesirable for two primary reasons. First, the highly energetic species cause more damage and lead to more defects in the as-deposited thin film material through collisions with the material during deposition. Second, the highly energetic species have a detrimental effect on the number density of SiH$_3$, a neutral radical that is believed to be the most preferred species for the deposition of high quality silicon-based photovoltaic materials. More specifically, the highly energetic species engage in interactions with SiH$_3$ that transform SiH$_3$ into a less desirable species. The interactions include collisions and abstraction reactions that remove hydrogen from SiH$_3$. The net result is a depletion of beneficial SiH$_3$ and production of deleterious species (e.g. SiH$_2$, a contributor to dihydride defects in amorphous silicon). Accordingly, in silane-based depositions, it may be desirable to exclude or extinguish the short-lived highly energetic species derived from silane from the plasma. Similar considerations apply to plasmas generated from germane (GeH$_4$).

For source materials that include fluorine, in contrast, certain short-lived species are beneficial. As noted above, the presence of fluorine reduces the concentration of defects in amorphous semiconductors by promoting regular fourfold coordination and passivating dangling bonds and other surface defects. The fluorine radical (F) is believed to be a short-lived species and its extinguishment before it reaches the growth front is undesirable. The participation of fluorine radicals in the deposition process can be increased in accordance with the instant invention by injecting a fluorinated source material (e.g. F$_2$, HF, fluorinated forms of silane, or fluorinated forms of germane) into the deposition apparatus at a position in close proximity to the substrate. If the delivery time of a particular fluorine-containing radical derived from a fluorinated source material to the substrate is less than the lifetime of the radical, the radical participates in the growth process before it is extinguished.

The considerations above extend to depositions that utilize multiple source materials. As a plasma or deactivated deposition medium formed from a first source material is allowed to evolve over time or distance to promote extinguishment of undesired short-lived species, the state of the plasma becomes less complex and more enriched in preferred species. If injection of a second source material occurs later in time or more remotely in space than injection of the first source material, the range of species encountered by the second source material is less diverse and a narrower distribution of species occurs in the composite plasma formed from the first and second source materials. By allowing the plasma of the first source material to evolve to a more preferred state, the range of interactions between the first and second source materials is reduced and fewer deleterious species are formed in the composite plasma.

Similarly, injection of short-lived species that reduce defect concentration can be delayed in time to permit a pre-existing plasma or deactivated deposition medium to evolve to a state that has a lesser tendency to negatively interact with the desired short-lived species. As noted above, the delivery point of desirable short-lived species can also be controlled to inject the short-lived species at a position within the deposition chamber where the short-lived species can participate in the deposition process before extinguishment or deleterious interactions with other species in a plasma or deactivated deposition medium can occur.

Figure 3:
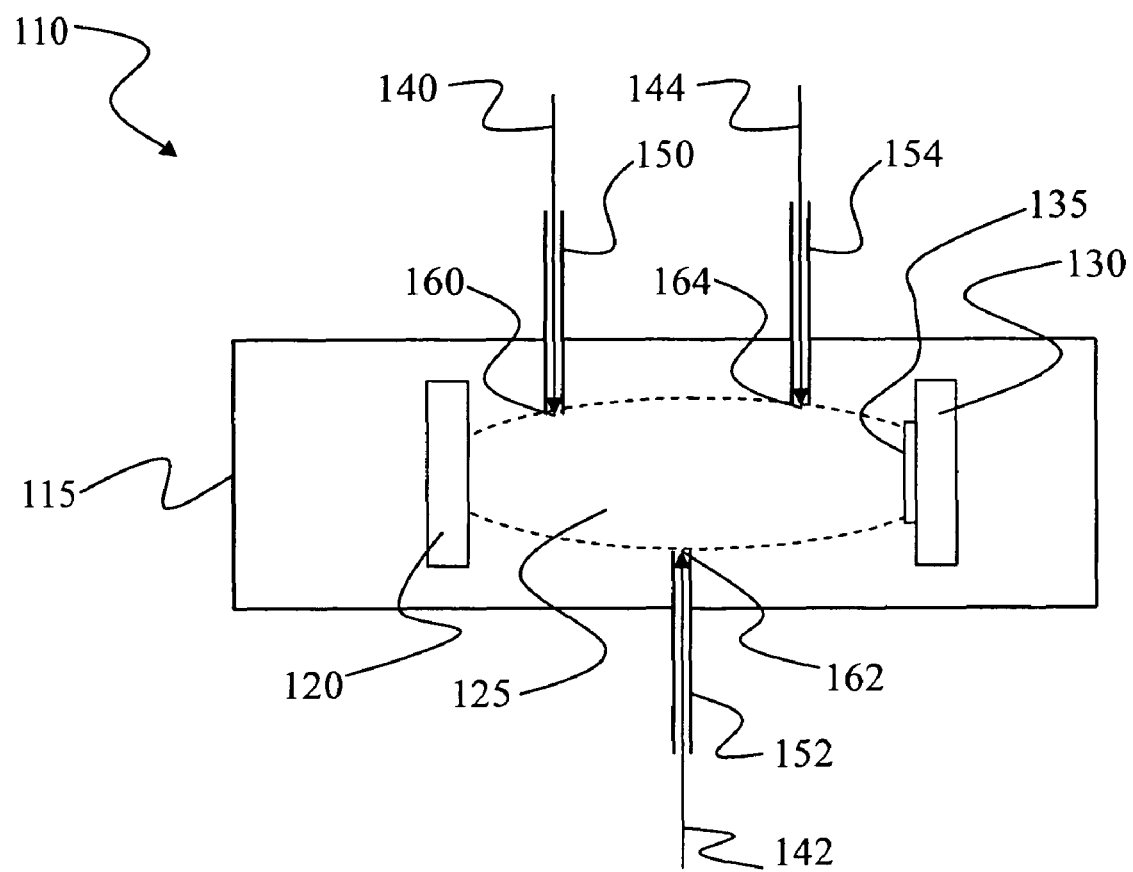
FIG. 3 depicts a plasma deposition system having multiple delivery points staggered in space.

FIG. 3 illustrates a plasma deposition system according to one embodiment of the instant invention. The system includes deposition apparatus 110 having deposition chamber 115 equipped with delivery devices 150, 152, and 154. Within deposition chamber 115 are cathode 120 and anode 130, with substrate 135 positioned thereon. Material streams 140, 142, and 144 are provided to deposition chamber 115 and directed toward different points in plasma region 125. Streams 140, 142, and 144 may deliver source materials (e.g. precursor gases, intermediates, metastable species), carrier gases, or mixed streams including a source material and a carrier gas. Stream 140 exits delivery device 150 at delivery point 160, stream 142 exits delivery device 152 at delivery point 162, and stream 144 exits delivery device 154 at delivery point 164. A power supply (not shown) connected to cathode 120 and anode 130 provides the electric field needed to initiate a plasma in region 125. The power supply may provide a DC or AC electric field. An AC electric field may be applied at a microwave frequency, radiofrequency, UHF frequency (e.g. GHz regime) or VHF frequency (e.g. MHz regime).

In deposition apparatus 110, delivery points 160, 162, and 164 are staggered in space in the direction extending from cathode 120 to substrate 135 and streams 140, 142, and 144 engage the plasma at different positions. Each stream may locally encounter a different distribution of species at its point of injection. Stream 140 injects a source material or carrier gas in close proximity to the cathode and the local region in the vicinity of delivery point 160 is enriched in species derived from stream 140. The general direction of transport in deposition apparatus 110 is toward substrate 135. The distribution of species present in the vicinity of delivery point 160 may evolve as the species progress toward substrate 135 so that the state of the plasma encountered by stream 142 may differ from that encountered by stream 140. Delivery point 162 is positioned to inject stream 142 at the point of evolution of the progressing plasma that promotes favorable interactions between stream 142 and the plasma. For example, as noted hereinabove, highly energetic species in the plasma generated from stream 140 may be extinguished or reduced in number density as the plasma evolves during transport. By delaying or staggering injection of stream 142, interactions between such highly energetic species and species from stream 142 can be minimized or avoided so that the distribution of species in the composite plasma formed in the vicinity of delivery point 162 is better optimized to provide a high quality thin film material upon deposition at substrate 135 (in a situation where highly energetic species are undesirable). Delivery point 164 is similarly placed to inject stream 144 at a point that optimizes the distribution of species in the composite plasma formed from stream 144 and the evolving plasma transported from the vicinity of delivery point 162.

Figure 4:
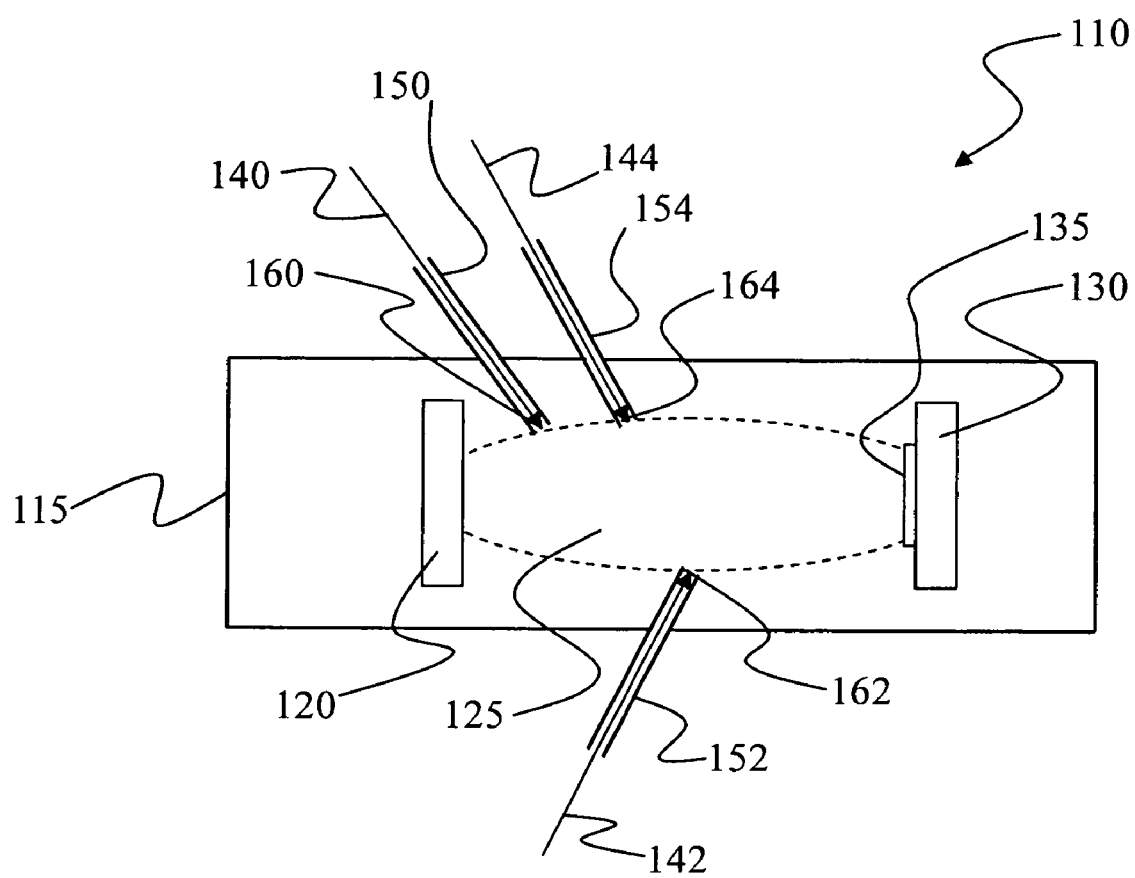
FIG. 4 depicts a plasma deposition system having multiple delivery points oriented to inject material streams in a direction having a component in the direction extending between the cathode and anode.

In the embodiment of FIG. 3, the delivery devices 150, 152, and 154 are oriented in a direction general orthogonal to the direction extending from cathode 120 to anode 130. In alternative embodiments, one or more of the delivery devices may be oriented at least partially in the direction extending from cathode 120 to anode 130. FIG. 4 shows a representative deposition system having a plurality of delivery devices angled to inject a stream in a direction having a component in the direction extending between cathode 120 and anode 130. The reference numerals in FIG. 4 correspond to those described hereinabove in FIG. 3.

Figure 5:
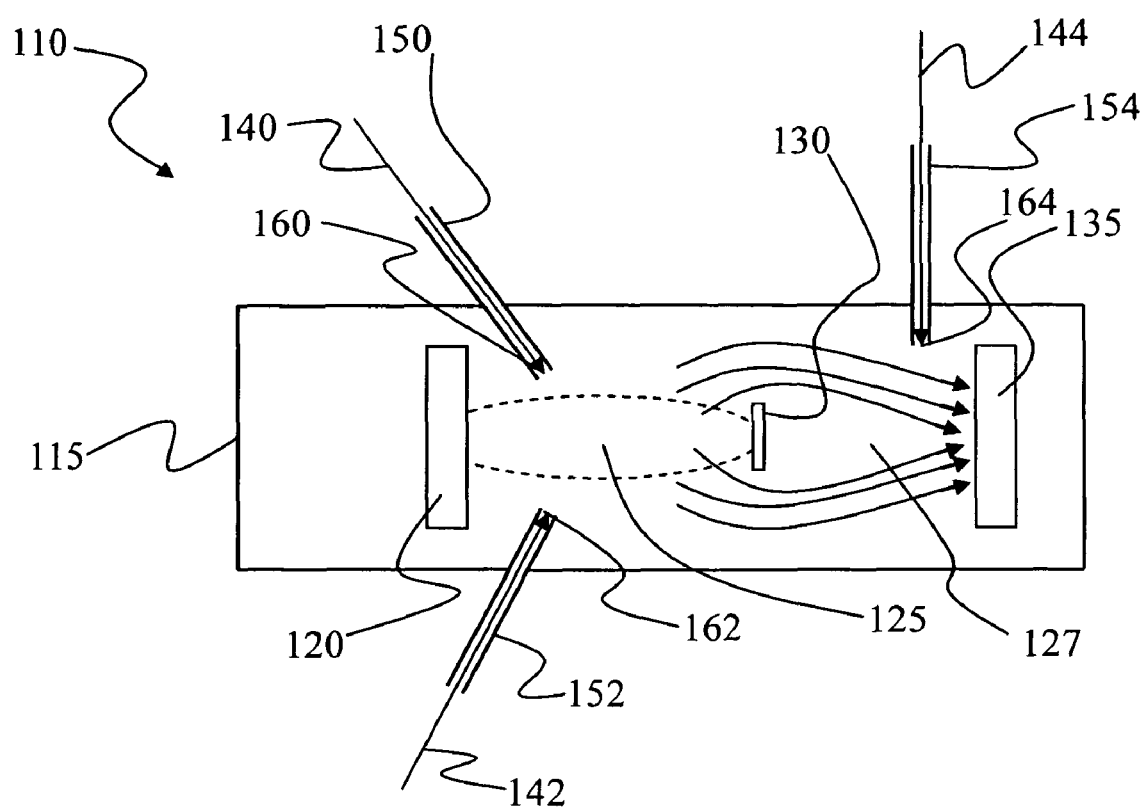
FIG. 5 depicts a deposition system having a plasma region and a region containing a deactivated deposition medium.
Figure 6:
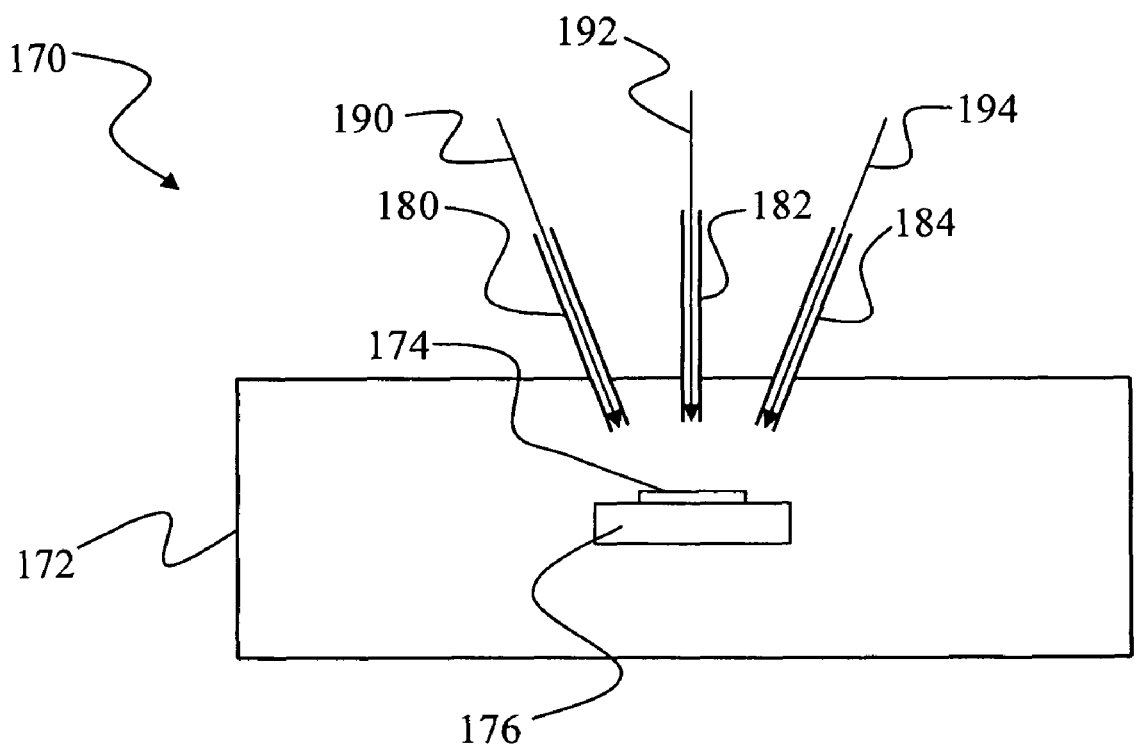
FIG. 6 depicts a deposition system that utilizes remote plasma sources to deliver material streams.

In other embodiments of the instant invention, the deposition apparatus includes an anode, a cathode and a substrate independent of the anode, where the substrate is positioned outside of plasma region formed between the anode and cathode. FIGS. 5 and 6 illustrate such embodiments of the instant invention. FIG. 5 shows an embodiment of a deposition chamber that includes a plasma region and a region that includes a deactivated deposition medium. The reference numerals shown in FIG. 5 correspond to those described hereinabove in FIG. 3. The apparatus of FIG. 5 includes plasma region 125 and a non-plasma region 127. Non-plasma region 127 exists generally between anode 130 and substrate 135 and contains a deactivated deposition medium. In the embodiment of FIG. 5, species generated in plasma region 125 are transported (e.g. via a carrier gas or pressure differential) out of plasma region 125 toward substrate 135. The pathway of transport is indicated generally with a series of arrows in FIG. 5. When the species exit plasma region 125, they deactivate to form a deactivated deposition medium that exists within non-plasma region 127. In the embodiment of FIG. 5, delivery device 154 is positioned to inject material stream 144 into the deactivated deposition medium located in non-plasma region 127 of deposition apparatus 115. In other embodiments, multiple delivery devices may be aligned or staggered along the direction extending between the anode (or cathode) and substrate to inject one or more material streams into the deactivated deposition medium portion of a deposition apparatus.

FIG. 6 depicts an embodiment of the instant invention that utilizes remote plasma delivery devices. Deposition apparatus 170 includes deposition chamber 172 having a mount 176 onto which substrate 174 is placed. Delivery devices 180, 182, and 184 inject material streams 190, 192, and 194, respectively, into deposition chamber 172. In the embodiment of FIG. 6, delivery devices 180, 182, and 184 are remote plasma sources. A remote plasma source is a source that receives one or more material streams as inputs and generates a plasma therefrom. The anode and cathode are incorporated as part of the remote plasma source. A plasma is formed in the interior of the remote plasma source and is injected through an aperture or opening into a deposition chamber. As it exits the remote plasma source, the plasma encounters a pressure drop, accelerates, and expands into the deposition chamber.

Species generated in the plasma are directed to substrate 174 and a thin film material is formed thereon. Injection from remote plasma sources 180, 182, and 184 may be pulsed, intermittent or continuous and the spatial position of the sources can be staggered in space as described hereinabove. Deposition systems in accordance with the instant invention may include a remote plasma source in combination with a nozzle. A material stream injected by a remote plasma source may be injected into a pre-existing plasma region within a deposition chamber or into a deactivated deposition medium.

The instant invention includes deposition systems having two or more delivery points for injecting two or more streams into a plasma deposition apparatus. FIGS. 3 and 4, for example, depict embodiments in which three streams are injected from delivery points staggered in space. In one embodiment of the instant invention, the two or more staggered delivery points are arranged to spatially coordinate delivery of multiple streams to promote optimization of interactions between species generated from different streams. Interactions between species can be selectively controlled through control over the presence or absence of species in the plasma or deactivated deposition medium encountered by an injected species. By allowing an upstream plasma or deactivated deposition medium to evolve to a selected state and staggering the points of delivery of two or more streams, the distribution of species, the energetic state, reactivity, collision frequency and other attributes of the plasma or deactivated deposition medium encountered by streams injected downstream can be controlled.

In another embodiment, the instant invention includes deposition systems having two or more delivery points where the injections of two or more streams into a deposition chamber are staggered in time. In this embodiment, a first stream is injected and activated to the plasma state and a second stream is injected and combined with the plasma (or a deactivated deposition medium derived from the plasma) at a later time. The delay in time permits the plasma activated from the first stream (or a deactivated deposition medium derived from such plasma) to evolve or develop to a state that more optimally interacts with the second stream. The delayed stream may be injected through the same or different delivery device as the earlier stream and if injected in a different delivery device, may be injected in a delivery device staggered (as in FIG. 3) or aligned (as in FIG. 1) in space relative to the delivery device that injects the earlier stream.

Streams staggered in time or space may be delivered in a continuous mode, an intermittent mode, or a combination thereof. In continuous mode, a stream is maintained as a continuous flow during deposition. In intermittent mode, a stream is injected in pulsed mode over one or more duty cycles. In pulsed mode, a burst of the stream is injected into the deposition apparatus and the flow is terminated or reduced after a period of time as the deposition continues. The stream may be cycled on and off one or more times, where the cycling may be periodic or non-periodic. In one embodiment, a first stream is initiated in continuous mode at an early time and a second stream is initiated in continuous mode at a later time. In another embodiment, a first stream is initiated in continuous mode at an early time and a second stream is initiated in pulsed mode at a later time. In still another embodiment, a first stream is initiated in pulsed mode at an early time and a second stream is initiated in continuous mode at a later time. In a further embodiment, a first stream is initiated in pulsed mode at an early time and a second stream is initiated in pulsed mode at a later time. Each stream may also be delivered in continuous mode over one time window and pulsed mode over a different time window. The invention extends to corresponding embodiments when three or more streams are employed, where each of several streams staggered in time and/or space are delivered in continuous mode, pulsed mode, or a combination thereof.

Figure 7:
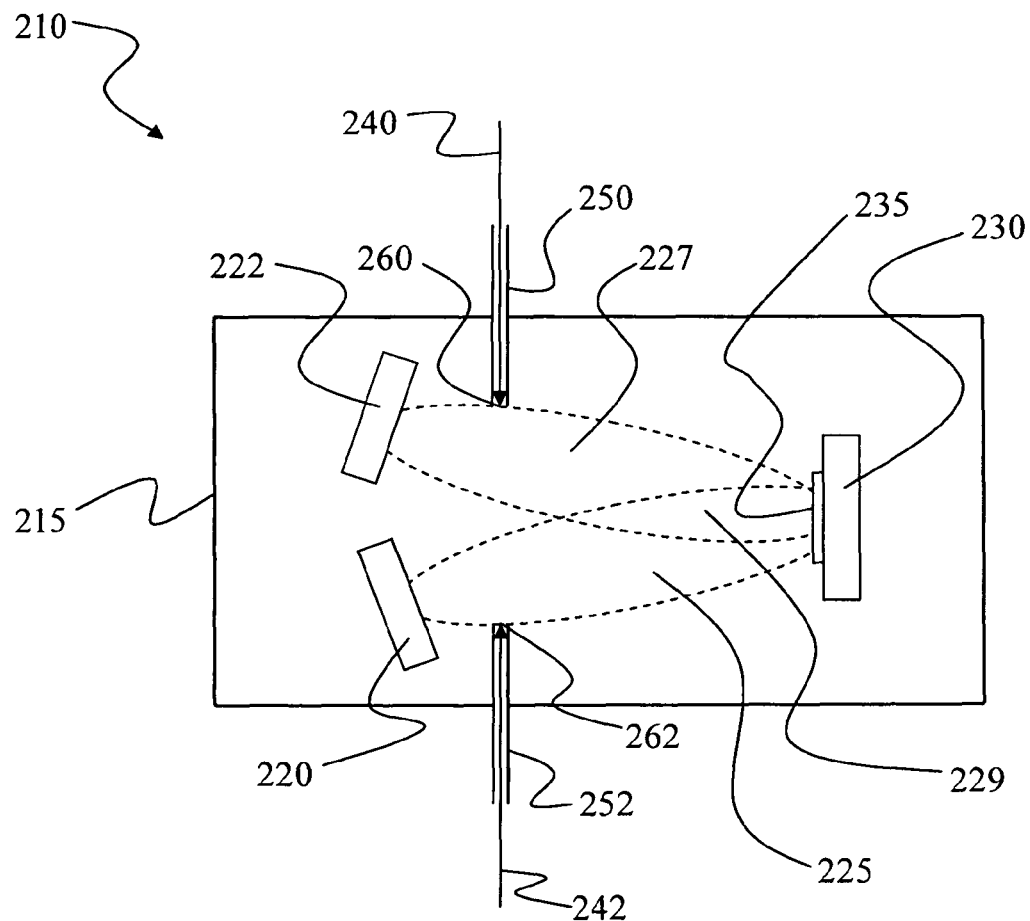
FIG. 7 depicts a plasma deposition system having two cathodes, a shared anode, and two plasma regions in which different material streams are injected.

In other embodiments, the principles of the instant invention extend to deposition systems that include two or more spatially separated plasma regions. The deposition system may include one or more cathodes in combination with one or more anodes, where two or more plasma regions are created. FIG. 7, for example, illustrates a plasma deposition system having two plasma regions. Plasma deposition system 210 includes deposition apparatus 210 having deposition chamber 215 equipped with delivery devices 250 and 252. Within deposition chamber 215 are first cathode 220, second cathode 222, and anode 230 with substrate 235 positioned thereon. Anode 230 is a shared anode and is used to establish first plasma region 225 with first cathode 220 and second plasma region 227 with second cathode 222. Stream 240 is provided to deposition chamber 215 and directed toward plasma region 225. Stream 242 is provided to deposition chamber 215 and directed toward plasma region 227. Streams 240 and 242 may deliver source materials (e.g. precursor gases, intermediates, metastable species), carrier gases, or mixed streams including a source material and a carrier gas. Stream 240 exits delivery device 250 at delivery point 260 and stream 242 exits delivery device 252 at delivery point 262. One or more power supplies (not shown) interconnected among first cathode 220, second cathode 230, and shared anode 230 provides the electric field needed to initiate plasmas in regions 225 and 227. The embodiment of FIG. 7 may also be modified to separate the substrate and anode to provide a deactivated region as described hereinabove in connection with FIG. 5.

In a multiple plasma region system, different streams are injected into separate plasma regions. Individual plasmas formed from the different streams are created in the absence of other streams and are allowed to evolve over time and space as described hereinabove to narrow or otherwise improve the distribution of species made available to the thin film growth region near the substrate. The evolved plasmas formed in separated plasma regions from different streams merge at combination region 229 to form a composite plasma that presents the distribution of species that participates in the formation of a thin film material on substrate 235.

In the context of the instant invention, a stream (or material stream or stream of material) is a supply or flow of material. The material may be a source material, carrier gas or combination thereof. As used herein, source materials are materials that contribute one or more elements to the thin film material formed on the substrate. Source materials include, for example, molecular deposition precursors, metastable or intermediate species derived from molecular deposition precursors, additives, and dopants. The source materials may be injected alone or in combination with a carrier gas. Carrier gases or gases to control the background pressure in the deposition apparatus may also be introduced separately from the source materials.

Source materials include molecular deposition precursors such as silane ($SiH_4$) and germane ($GeH_4$). Source materials also include fluorinated silicon and germanium compounds such as $SiF_4$, $GeF_4$, fluorinated forms of silane ($SiF_3H$, $SiF_2H_2$, $SiFH_3$), and fluorinated forms of germane ($GeF_3H$, $GeF_2H_2$, $GeFH_3$). Tin precursors (e.g. $SnH_4$, $SnCl_4$, $SnF_4$, $SnF_2$ etc.) may also serve as source materials. The advantages of fluorine have been amply demonstrated by S.R. Ovshinsky. In particular, S.R. Ovshinsky has shown that the inclusion of fluorine promotes the regular coordination of silicon, germanium and other constituents of thin film materials, acts to passivate dangling bonds and other defects, and in appropriate quantities, acts to promote the formation of nanocrystalline, intermediate range order, or microcrystalline phases of silicon and germanium. S.R. Ovshinsky has further demonstrated that by promoting the formation of nanocrystalline, intermediate range order, or microcrystalline phases of silicon and germanium, the use of fluorine improves hole mobility. (For more information see, for example, the following references by S.R. Ovshinsky: U.S. Pat. No. 5,103,284 (formation of nanocrystalline silicon from $SiH_4$ and $SiF_4$); U.S. Pat. No. 4,605,941 (showing substantial reduction in defect states in amorphous silicon prepared in presence of fluorine); and U.S. Pat. No. 4,839,312 (presents several fluorine-based precursors for the deposition of amorphous and nanocrystalline silicon)).

Source materials also include metastable or intermediate species. In U.S. patent application Ser. No. 12/209,699 ('699 application), the disclosure of which is incorporated by reference herein, S.R. Ovshinsky discussed the benefits of preselecting preferred metastable or intermediate species for thin film deposition. An objective of the '699 application was to minimize the presence of undesirable species in the plasma used to form a thin film material. The strategy employed in the '699 application was to deliver preferred metastable or intermediate species in a pure form to a deposition system to avoid deleterious interactions between undesirable species and preferred species when the preferred species are generated in a conventional plasma.

In one embodiment of the instant invention, a metastable or intermediate species is derived from a molecular deposition precursor. The metastable or intermediate species may be stabilized outside of the deposition chamber and provided as a stream through a delivery device or it may be created from a molecular deposition precursor immediately before entering the delivery device, upon entering the delivery device, or upon entry to the deposition chamber of the instant system. Neutral radicals are one embodiment of a preferred metastable or intermediate species. In the case of silicon and germanium based depositions, $SiH_3$ and $GeH_3$, respectively, are believed to be particularly favorable deposition species. Metastable source materials also include fluorinated neutral radicals such as $SiF_2H$, $SiFH_2$, $SiF_3$, $GeF_2H$, $GeFH_2$, and $GeF_3$.

Source materials also include treatment materials that react with the as-deposited material (typically via a surface reaction) or passivate defects in the as-deposited material. Treatment sources may also act as diluents. Treatment sources include hydrogen ($H_2$ or H) and fluorine ($F_2$, HF, $CF_4$, $SF_6$, $NF_3$, $SiF_6$, or F). Hydrogen and fluorine are known to saturate dangling bonds in silicon and germanium-based photovoltaic materials and to promote more regular fourfold coordination. Hydrogen and fluorine also promote formation of regions of nanocrystalline or intermediate range order material within otherwise amorphous photovoltaic materials. Nanocrystalline and intermediate range order material is beneficial because it improves the mobility of minority carriers in photovoltaic materials.

Source materials also include streams that provide dopants to the as-deposited thin film material. Dopant sources provide elements to the thin film that impart n-type or p-type conductivity. Representative dopant sources include $NH_3$, $N_2$, $AsH_3$, $PH_3$, $PH_5$, $SF_6$, $BF_3$, $B_2H_6$, $BH_3$, and combinations thereof.

Carrier gases are gases that do not contribute an element to the thin film composition being deposited and are generally used to dilute source materials. Representative carrier gases in accordance with the instant invention may include neon (Ne), helium (He), argon (Ar), krypton (Kr), xenon (Xe), or combinations thereof. For some thin film compositions, hydrogen ($H_2$) or nitrogen ($N_2$) may also function as carrier gases. In a preferred embodiment, the carrier gas is chemically inert with respect to source materials employed in the deposition.

The delivery devices of the instant deposition system generally include means for supplying a stream of material to a deposition chamber. In one embodiment, the delivery device supplies a gas phase stream to the deposition chamber. Delivery devices include tubes, conduits, pipes, nozzles, jets, and remote plasma sources. Nozzles are a flexible delivery device because the size, shape, and taper of a nozzle can be used to control velocity at which a source material or carrier gas is delivered to the deposition chamber and, in the case of metastable or intermediate species, can be used to help create or transmit preferred species. The nozzle may, for example, be charged or may serve as a cathode in the plasma activation process. Remote plasma sources are another desirable delivery device because they afford flexibility in the delivery of excited species to a deposition chamber. A remote plasma source creates a distribution of species from a source material and injects them as a beam or jet into a deposition chamber. A wide variety of source materials can be activated in a remote plasma source to produce species for deposition.

The delivery devices may be fixed in position or moveable. Motion of a delivery device may be in a horizontal or vertical direction or a combination thereof. Translation, oscillation or other motion of a delivery device may occur between depositions or during deposition of a thin film material. Motion of a delivery device provides additional degrees of freedom in controlling the distribution of species present in the deposition chamber. Motion of a delivery device during deposition may occur in conjunction with time synchronization of injection so that injection is controlled in both space and time.

In U.S. patent application Ser. Nos. 10/043,010 ('010 application) and 11/447,363 ('363 application), the disclosures of which are incorporated by reference herein, S.R. Ovshinsky described a pore cathode concept in which the cathode used in a plasma deposition process was perforated with a series of pore openings, where the deposition precursor was introduced through the pores. By controlling the size, shape, and pitch of the pores, S.R. Ovshinsky demonstrated that the distribution of species in the plasma formed from the deposition precursor could be controlled. Control over the characteristics of the pores enables new plasma chemistry and physics, including at the quantum level through wavefunction engineering, that permits formation of a plasma having a tailored distribution of species. The pores can be designed to selectively create or transmit pre-selected species and to suppress the formation of species deleterious to the structural or electronic integrity of the depositing thin film material.

In this invention, the benefits of the pore cathode are extended to the delivery points of a deposition system that utilizes a conventional cathode. Embodiments of the delivery device include devices having an exit or delivery point that is engineered in size, shape, taper, or electric field strength to promote generation, stabilization, and transport of preferred deposition species. The new plasma chemistry and physics described in the '010 and '363 applications are directly transferrable to delivery devices that inject a stream into the interior of a deposition chamber.

The delivery devices can be configured to provide a particular species or subset of species from among a wider distribution of species present in a material stream. The size of the opening through which a stream exits the delivery device to enter the deposition chamber provides one degree of freedom in controlling the identity of species injected by the delivery device. If the opening is large, the delivery device injects the stream in the state it was supplied at the inlet of the delivery device. As the size of the opening decreases, however, the flow of the stream becomes restricted and the separation between the constituents of the flow decreases. As a result, new interactions develop between the constituents and these interactions produce otherwise unavailable species for injection to the delivery chamber. In particular, when the size of the opening is reduced to a size approaching molecular dimensions, the opening can be used to selectively transmit constituents in a stream according to size. In this embodiment, constituents having molecular dimensions below a critical dimension defined by the size of the opening are injected into the deposition chamber and constituents above the critical dimension are rejected. In one embodiment, the opening has a cross-sectional dimension of less than 10 µm. In another embodiment, the opening has a cross-sectional dimension of less than 1 µm. In still another embodiment, the opening has a cross-sectional dimension of between 0.1 mm and 10mm.

In addition, a voltage may be applied along or at the opening of the delivery device. As the size of the opening decreases, the local electric field produced by the voltage at the opening increases. When the size of the opening approaches the scale of molecular dimensions, extremely high local electric fields are generated and these fields produce a unique distribution of species from a flowing stream as it exits the delivery device.

The spacing between the delivery points of different delivery devices provides a second degree of freedom in controlling the identity of species injected into the deposition chamber. The spacing between different delivery devices can be large enough to permit each delivery device to function as an independent supply of a stream, where the characteristics of the delivery device control the nature and distribution of species injected into the deposition chamber as noted above. In one embodiment, the spatial separation between delivery devices corresponds to the spatial separation between the delivery points of the delivery devices. In another embodiment, the spatial separation between delivery devices is assessed as the displacement of the delivery point of one delivery device relative to the delivery point of another delivery device along a direction extending from the cathode to the anode of the deposition chamber or a direction extending from the cathode or anode to the substrate in the deposition chamber. A direction extending from the cathode to the anode may be referred to herein as a longitudinal direction. A direction extending from the cathode or anode to the substrate may be referred to herein as a direction of transport of a deposition medium. In one embodiment, the spatial separation of the delivery points of two or more delivery devices is greater than or equal to 1 mm in a longitudinal direction. In another embodiment, the spatial separation of the delivery points of two or more delivery devices is greater than or equal to 10 mm in a longitudinal direction. In another embodiment, the spatial separation of the delivery points of two or more delivery devices is greater than or equal to 100 mm in a longitudinal direction.

In this embodiment, the overall distribution of species in the composite plasma resulting from multiple delivery points is harmonized through independent control of each of the delivery points. In one embodiment, the deposition system includes a first delivery device optimized to deliver a stream enriched in the neutral radical $SiH_3$ and a second delivery device optimized to deliver a stream enriched in the neutral radical $GeH_3$ or the neutral radical $SiF_3$. Different delivery devices may also deliver a combination of a metastable or intermediate species and a molecular deposition precursor or a combination of multiple molecular deposition precursors.

Alternatively, the spacing between different delivery devices can be narrowed to invoke quantum interactions and wavefunction overlap between constituents of the streams exiting the delivery devices to provide a synergy between streams. The synergy provides unique species through mutual, quantum-level interactions between streams and provides a degree of freedom for optimizing the distribution of species in a composite plasma formed from two streams. In practice, the delivery points can be configured as a mesh of closely spaced openings located on the exterior wall of the deposition chamber. The delivery devices may also be arranged so that the delivery points pierce the exterior wall and enter the interior of the chamber (as shown, for example, in FIGS. 3-5). In one embodiment, the spacing between delivery points is less than 100 μm. In one embodiment, the spacing between delivery points is less than 10 μm. In another embodiment, the spacing between delivery points is less than 1 μm. In still another embodiment, the spacing between delivery points is less than 100 nm.

Those skilled in the art will appreciate that the methods and designs described above have additional applications and that the relevant applications are not limited to the illustrative examples described herein. The present invention may be embodied in other specific forms without departing from the essential characteristics or principles as described herein. The embodiments described above are to be considered in all respects as illustrative only and not restrictive in any manner upon the scope and practice of the invention. It is the following claims, including all equivalents, which define the true scope of the instant invention.

With regard to steps in methods of the instant invention, it is to be understood that the order of the different individual steps may be varied or reversed consistent with operability of the invention as described herein.

I claim:

1. A method of forming a thin film material comprising:
providing a deposition chamber; said deposition chamber including a substrate, a pore cathode having one or more pores for supplying a gas to said deposition chamber, a first anode, a first delivery device, and a second delivery device; said deposition chamber having a first direction extending from said pore cathode to said first anode; said first delivery device including a first delivery point; said second delivery device including a second delivery point positioned between said first delivery point and said substrate; said second delivery point being spatially displaced from said first delivery point in said first direction, with said second delivery point being between said pore cathode and said first anode;
supplying a gas to said deposition chamber through said pores of said pore cathode;
providing a first material stream to said first delivery device, said first delivery device injecting said pore material stream into said deposition chamber; establishing an electric field between said pore cathode and said first anode, said electric field initiating a plasma, said plasma comprising species derived from said gas and said first material stream, said plasma having a first distribution of species adjacent to said first delivery point and a second distribution of species adjacent to said second delivery point, the average lifetime of species in said second distribution differing from the average lifetime of species in said first distribution; and
providing a second material stream to said second delivery device, said second delivery device injecting said second material stream into said plasma to form a composite plasma, said composite plasma comprising species derived from said gas, said first material stream and said second material stream.

2. The method of claim 1, wherein the separation between said first delivery point and said second delivery point in said first direction is greater than or equal to 1 mm.

3. The method of claim 1, wherein the separation between said first delivery point and said second delivery point in said first direction is greater than or equal to 10 mm.

4. The method of claim 1, wherein the separation between said first delivery point and said second delivery point in said first direction is less than 1 mm.

5. The method of claim 1, wherein the separation between said first delivery point and said second delivery point in said first direction is less than 100 μm.

6. The method of claim 1, wherein said electric field oscillates at a microwave frequency, radiofrequency, ultrahigh frequency, or very high frequency.

7. The method of claim 1, wherein said first material stream comprises silicon or germanium.

8. The method of claim 7, wherein said first material stream comprises silane, disilane, or germane.

9. The method of claim 7, wherein said first material stream comprises the neutral radical $SiH_3$ or the neutral radical $GeH_3$.

10. The method of claim 7, wherein said second material stream comprises silicon or germanium.

11. The method of claim 7, wherein said second material stream comprises fluorine.

12. The method of claim 1, wherein said first material stream comprises fluorine.

13. The method of claim 12, wherein said first material stream comprises a fluorinated form of silane.

14. The method of claim 13, wherein said first material stream comprises $SiF_4$, $SiF_3H$, $SiF_2H_2$, or $SiFH_3$.

15. The method of claim 1, wherein said first material stream is injected intermittently.

16. The method of claim 15, wherein said second material stream is injected intermittently.

17. The method of claim 15, wherein said first material stream is pulsed periodically into said deposition chamber, said periodic pulsing including alternating on cycles and off cycles, said first material stream being delivered at a first flow rate during said on cycles, said first material stream being delivered at a second flow rate during said off cycles, said first flow rate exceeding said second flow rate.

18. The method of claim 17, wherein said second material stream is injected during said off cycles and not during said on cycles.

19. The method of claim 1, wherein the average lifetime of species in said second distribution is longer than the average lifetime of species in said first distribution.

20. The method of claim 1, wherein the number density of neutral radicals is higher in said second distribution of species than in said first distribution of species.

21. The method of claim 20, wherein the number density of the neutral radical $SiH_3$ is higher in said second distribution of species than in said first distribution of species.

22. The method of claim 1, wherein said composite plasma has a first distribution of species adjacent to said second point of delivery and a second distribution of species adjacent to said substrate.

23. The method of claim 22, wherein said second distribution of said composite plasma has a higher number density of neutral radicals than said first distribution of said composite plasma.

24. The method of claim 1, wherein said deposition chamber further includes a third delivery device having a third point of delivery and said method further comprises:
providing a third material stream to said third delivery device, said third delivery device injecting said third stream into said composite plasma to form a second composite plasma.

25. The method of claim 1, wherein said deposition chamber further includes a second cathode and a third delivery device, said third delivery device including a third point of delivery, said method further comprising:
establishing a secondary electric field between said second cathode and said first anode; said secondary electric field initiating a plasma from said second material stream;
providing a third material stream to said third delivery device, said third delivery device injecting said third material stream into said plasma initiated by said secondary electric field.

26. The method of claim 1, further comprising:
introducing a background gas into said deposition chamber, said plasma further comprising species derived from said background gas.

27. The method of claim 26, wherein said background gas comprises argon, neon, helium, xenon, krypton, hydrogen, or nitrogen.

28. The method of claim 1, wherein said first delivery device is a remote plasma source.

29. The method of claim 28, wherein said second delivery device is a remote plasma source.

30. The method of claim 1, wherein said substrate is positioned on said first anode.

31. A method of forming a thin film material comprising:
providing a deposition chamber; said deposition chamber including a substrate, a first cathode, a first anode, a first delivery device, and a second delivery device; said deposition chamber having a first direction extending from said first cathode to said first anode; said first delivery device comprising a nozzle and including a first delivery point, said nozzle having an opening at said first delivery point; said second delivery device including a second delivery point positioned between said first delivery point and said substrate; said second delivery point being spatially displaced from said first delivery point in said first direction, with said second delivery point being between said first cathode and said first anode;
providing a first material stream to said first delivery device, said first delivery device injecting said first material stream into said deposition chamber; establishing an electric field between said first cathode and said first anode, said electric field initiating a plasma, said plasma comprising species derived from said first material stream, said plasma having a first distribution of species adjacent to said first delivery point and a second distribution of species adjacent to said second delivery point, the average lifetime of species in said second distribution differing from the average lifetime of species in said first distribution; and
providing a second material stream to said second delivery device, said second delivery device injecting said second material stream into said plasma to form a composite plasma, said composite plasma comprising species derived from said first material stream and said second material stream.

32. The method of claim 31, wherein said opening has a cross-sectional dimension of less than 10 μm.

33. The method of claim 31, wherein said opening has a cross-sectional dimension of less than 1 μm.

34. The method of claim 31, wherein said opening has a cross-sectional dimension of between 0.1 mm and 10 mm.

35. The method of claim 31, wherein said second delivery device comprises a nozzle, said nozzle having an opening at said second delivery point.

36. The method of claim 35, wherein said opening at said second delivery point has a cross-sectional dimension of between 0.1 mm and 10 mm.

37. The method of claim 31, wherein said substrate is positioned on said first anode.

38. The method of claim 31, wherein the separation between said first delivery point and said second delivery point in said first direction is greater than or equal to 1 mm.

39. The method of claim 31, wherein the separation between said first delivery point and said second delivery point in said first direction is greater than or equal to 10 mm.

40. The method of claim 31, wherein the separation between said first delivery point and said second delivery point in said first direction is less than 1 mm.

41. The method of claim 31, wherein the separation between said first delivery point and said second delivery point in said first direction is less than 100 μm.

42. The method of claim 31, wherein said electric field oscillates at a microwave frequency, radiofrequency, ultra-high frequency, or very high frequency.

43. The method of claim 31, wherein said first material stream comprises silicon or germanium.

44. The method of claim 43, wherein said first material stream comprises silane, disilane, or germane.

45. The method of claim 43, wherein said first material stream comprises the neutral radical $SiH_3$ or the neutral radical $GeH_3$.

46. The method of claim 43, wherein said second material stream comprises silicon or germanium.

47. The method of claim 43, wherein said second material stream comprises fluorine.

48. The method of claim 31, wherein said first material stream comprises fluorine.

49. The method of claim 48, wherein said first material stream comprises a fluorinated form of silane.

50. The method of claim 49, wherein said first material stream comprises $SiF_4$, $SiF_3H$, $SiF_2H_2$, or $SiFH_3$.

51. The method of claim 31, wherein the average lifetime of species in said second distribution is longer than the average lifetime of species in said first distribution.

52. The method of claim 31, wherein the number density of neutral radicals is higher in said second distribution of species than in said first distribution of species.

53. The method of claim 52, wherein the number density of the neutral radical $SiH_3$ is higher in said second distribution of species than in said first distribution of species.

54. The method of claim 31, wherein said composite plasma has a first distribution of species adjacent to said second point of delivery and a second distribution of species adjacent to said substrate.

55. The method of claim 54, wherein said second distribution of said composite plasma has a higher number density of neutral radicals than said first distribution of said composite plasma.

56. The method of claim 31, wherein said deposition chamber further includes a third delivery device having a third point of delivery and said method further comprises:
providing a third material stream to said third delivery device, said third delivery device injecting said third stream into said composite plasma to form a second composite plasma.

57. The method of claim 31, wherein said deposition chamber further includes a second cathode and a third delivery device, said third delivery device including a third point of delivery, said method further comprising:
establishing a secondary electric field between said second cathode and said first anode; said secondary electric field initiating a plasma from said second material stream;
providing a third material stream to said third delivery device, said third delivery device injecting said third material stream into said plasma initiated by said secondary electric field.

58. The method of claim 31, further comprising:
introducing a background gas into said deposition chamber, said plasma further comprising species derived from said background gas.

59. The method of claim 58, wherein said background gas comprises argon, neon, helium, xenon, krypton, hydrogen, or nitrogen.

60. The method of claim 31, wherein said first delivery device is a remote plasma source.

61. The method of claim 60, wherein said second delivery device is a remote plasma source.

62. A method of forming a thin film material comprising:
providing a deposition chamber; said deposition chamber including a substrate, a first cathode, a first anode, a first delivery device, and a second delivery device; said deposition chamber having a first direction extending from said first cathode to said first anode; said first delivery device including a first delivery point; said second delivery device including a second delivery point positioned between said first delivery point and said substrate; said second delivery point being spatially displaced from said first delivery point in said first direction, with said second delivery point being between said first cathode and said first anode;
providing a first material stream to said first delivery device, said first material stream comprising a first metastable species, said first delivery device injecting said first material stream into said deposition chamber; establishing an electric field between said first cathode and said first anode, said electric field initiating a plasma, said plasma comprising species derived from said first material stream;
providing a second material stream to said second delivery device, said second material stream comprising a second metastable species, said second metastable species having a shorter lifetime than said first metastable species, said second delivery device injecting said second material stream into said plasma to form a composite plasma, said composite plasma comprising species derived from said first material stream and said second material stream; and
forming a thin film from said composite plasma, said thin film including an element derived from said first material stream.

63. The method of claim 62, wherein said thin film material includes an element derived from said first metastable species.

* * * * *